(12) United States Patent
Limotyrakis et al.

(10) Patent No.: US 8,614,638 B1
(45) Date of Patent: Dec. 24, 2013

(54) HYBRID SUCCESSIVE APPROXIMATION ANALOG-TO-DIGITAL CONVERTER

(75) Inventors: Sotirios Limotyrakis, Mountain View, CA (US); Michael Peter Mack, Sunnyvale, CA (US); Hyunsik Park, Palo Alto, CA (US); Sang-Min Lee, Palo Alto, CA (US); Brian James Kaczynski, Cracow (PL); MeeLan Lee, Los Altos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 16 days.

(21) Appl. No.: 13/527,291

(22) Filed: Jun. 19, 2012

(51) Int. Cl.
*H03M 1/38* (2006.01)
(52) U.S. Cl.
USPC .......................... 341/161; 341/155; 341/162
(58) Field of Classification Search
USPC ......................... 341/161, 155, 162
See application file for complete search history.

(56) References Cited

U.S. PATENT DOCUMENTS

| | | | |
|---|---|---|---|
| 7,471,229 B2* | 12/2008 | Schofield et al. | 341/162 |
| 2005/0078026 A1* | 4/2005 | Cai | 341/162 |
| 2007/0290913 A1* | 12/2007 | Schofield et al. | 341/155 |

* cited by examiner

*Primary Examiner* — Jean B Jeanglaude
(74) *Attorney, Agent, or Firm* — DeLizio Gilliam, PLLC

(57) ABSTRACT

A hybrid SAR ADC can be implemented to reduce the number of operations that are executed to convert an analog input signal into its digital representation. Pipeline processing operations can be executed on the analog input signal to generate pipeline bits (MSBs of the digital representation) and an analog residue signal. The analog residue signal can be compared against a plurality of thresholds to generate comparator bits that are indicative of a range associated with a subset of the predetermined thresholds that correspond to the analog residue signal. Successive approximation analog-to-digital conversion operations can be executed on the analog residue signal to generate successive approximation bits. The digital representation can be determined based, at least in part, on the pipeline bits, the comparator bits, and the successive approximation bits.

27 Claims, 7 Drawing Sheets

HYBRID SUCCESSIVE APPROXIMATION ANALOG-TO-DIGITAL CONVERTER

BACKGROUND

Embodiments of the inventive subject matter generally relate to the field of signal processing devices and, more particularly, to a hybrid successive approximation analog-to-digital converter (ADC).

An ADC that employs a successive approximation register (SAR) referred to herein as a "SAR ADC" converts a continuous analog input signal into a discrete digital representation of the analog input signal. The SAR ADC executes binary search operations by comparing, at each iteration, the analog input signal against a threshold determined as part of the binary search operations. The SAR ADC generates a digital bit (at logic zero or at logic one) at each iteration based on the result of the comparison.

SUMMARY

Various embodiments of a hybrid successive approximation analog-to-digital converter (ADC) are disclosed. In one embodiment, pipeline processing operations are executed on an analog input signal to generate one or more pipeline bits and an analog residue signal in response to receiving, at a signal processing device, the analog input signal to be converted to a corresponding digital output signal. The one or more pipeline bits are most significant bits of the digital output signal. The analog residue signal is compared against a plurality of predetermined thresholds to generate one or more comparator bits that are indicative of a range associated with a subset of the predetermined thresholds. Successive approximation analog-to-digital conversion operations are executed on the analog residue signal to generate a plurality of successive approximation bits. The digital output signal is determined based, at least in part, on the one or more pipeline bits, the one or more comparator bits, and the plurality of successive approximation bits.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
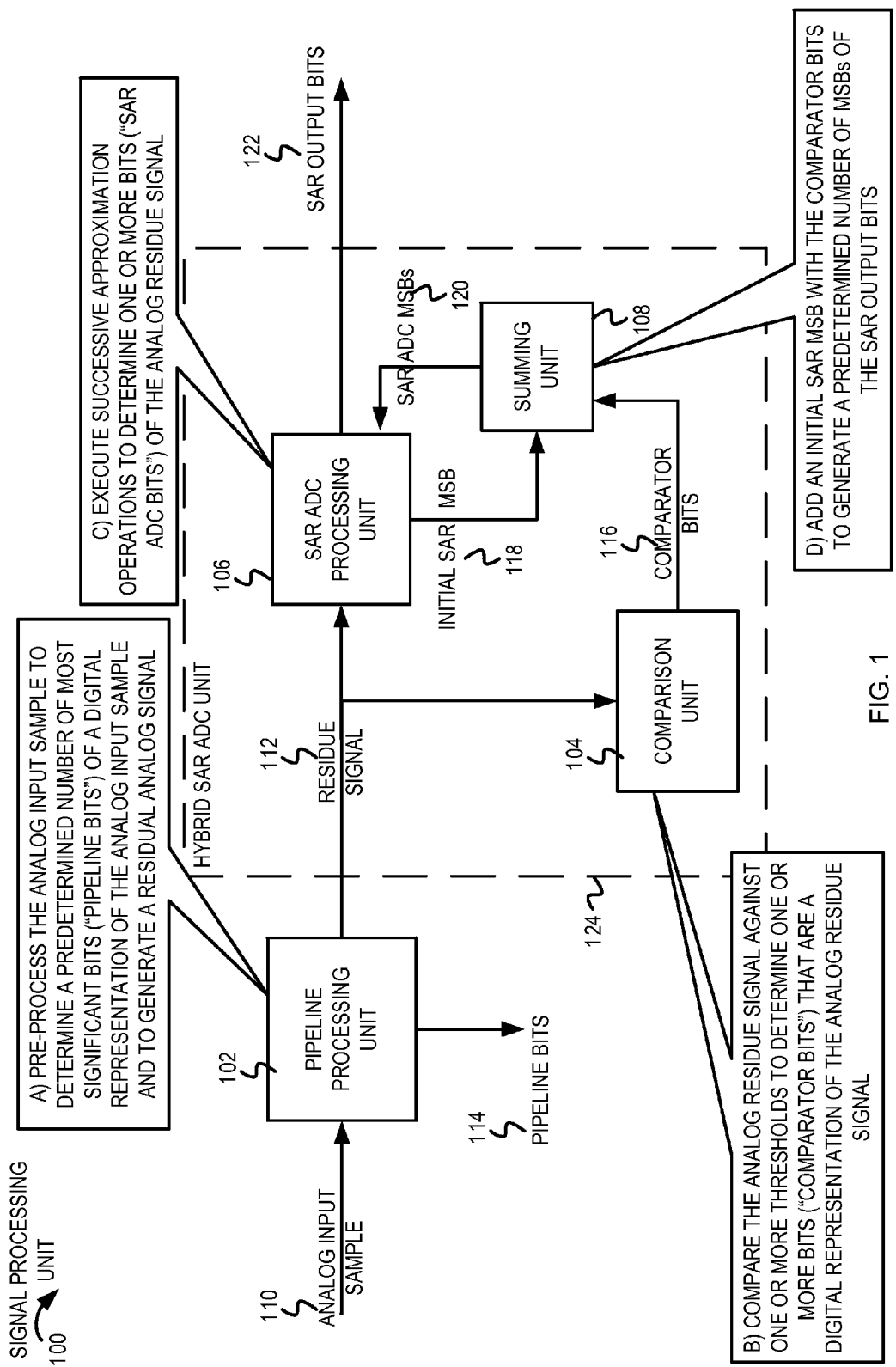
FIG. 1 is a block diagram illustrating one embodiment of an analog-to-digital conversion (ADC) process including a hybrid successive approximation (SAR) ADC mechanism.

The description that follows includes exemplary systems, methods, techniques, instruction sequences, and computer program products that embody techniques of the present inventive subject matter. However, it is understood that the described embodiments may be practiced without these specific details. For instance, although examples refer to executing hybrid SAR ADC operations in a wireless local area network (WLAN) device, embodiments are not so limited. In other embodiments, the hybrid SAR ADC operations described herein can be implemented by other communication devices that implement other wireless (e.g., Bluetooth®) or wired (e.g., Ethernet) communication standards/protocols. Furthermore, although embodiments describe a hybrid successive approximation ADC for use in communication applications, in other embodiments, the hybrid successive approximation ADC described herein can be extended to instrumentation applications and other applications that utilize analog-to-digital conversion. In other instances, well-known instruction instances, protocols, structures, and techniques have not been shown in detail in order not to obfuscate the description.

To determine a digital representation ("digital output signal") of an analog input signal, a traditional SAR ADC process identifies a first range within which the analog input signal can lie (typically this is the analog input full-scale range). The traditional SAR ADC process compares the analog input signal against a midpoint of the first range, determines whether the analog input signal lies above or below the midpoint, and stores the result (e.g., a most significant bit at logic 0 or logic 1) in the SAR. The traditional SAR ADC process then determines a second range as an upper half of the first range (e.g., if the analog input signal was above the midpoint of the first range) or a lower half of the first range (e.g., if the analog input signal was below the midpoint of the first range). The traditional SAR ADC process compares the analog input signal against a midpoint of the second range and stores the result (e.g., a second MSB at logic 0 or logic 1) in the SAR. The traditional SAR ADC process continues to execute the above-described operations until the digital output signal is determined. Thus, the traditional SAR ADC process can execute, for example, 10 iterations (each comprising operations for identifying the range, setting the threshold as the midpoint of the range, comparing the analog input signal against the threshold, and accordingly determining the result) to yield, for example, corresponding 10 bits of the digital output signal. Because the successive approximation ADC process is an iterative process and one bit of the digital output signal is determined at each iteration, the speed with which an analog signal can be converted into a corresponding digital signal using the successive approximation ADC process depends on how long each such iteration takes. The traditional SAR ADC process typically executes multiple iterations of the above-described operations for determining the digital representation of a first sample of the analog input signal within the time interval between successive sample acquisitions. The number of comparison operations and threshold reset operations that are executed within the time interval between successive sample acquisitions can depend on the desired digital resolution. Executing multiple comparison operations and threshold reset operations may utilize expensive high-speed comparators and can consume a lot of time and power.

In some implementations, a hybrid SAR ADC unit can be implemented to reduce the number of operations that are executed to determine the digital output signal. The hybrid SAR ADC unit can comprise a comparison unit and a SAR ADC processing unit. The comparison unit can compare the analog input against a plurality of thresholds to determine a subset of the bits of the digital output signal. The SAR ADC processing unit can execute the SAR ADC process to determine the remaining bits of the digital output signal. This can ensure that the hybrid SAR ADC unit executes a fewer number of iterations of the SAR ADC operations to determine the digital output signal. For example, the comparison unit may determine 2 bits and the SAR ADC processing unit may determine 8 bits of the digital output signal to yield a 10-bit resolution of the digital output signal. Such a hybrid SAR ADC mechanism can reduce the amount of time consumed in converting the analog input signal into its corresponding digital representation. The hybrid SAR ADC mechanism can also reduce the power consumption and the number of successive operations executed for converting the analog input signal into its corresponding digital representation. Such a hybrid SAR ADC mechanism can minimize the need for expensive high-speed comparators and tight comparator thresholds.

FIG. 1 is a block diagram illustrating one embodiment of an analog-to-digital conversion (ADC) process including a hybrid successive approximation (SAR) ADC mechanism. FIG. 1 depicts a portion of a signal processing unit 100 of an electronic device. The signal processing unit 100 comprises a pipeline processing unit 102 and a hybrid SAR ADC unit 124. The hybrid SAR ADC unit 124 comprises a comparison unit 104, a SAR ADC processing unit 106, and a summing unit 108. Although not depicted in FIG. 1, the signal processing unit 100 may be implemented in a communication device that implements protocols and functionality to enable communication with other devices in a suitable wired or wireless communication network. In one example, the signal processing unit 100 may be implemented in a wireless local area network (WLAN) device (e.g., a system-on-a-chip or other type of IC with IEEE 802.11 capabilities). In some implementations, the signal processing unit 100 can be implemented in one or more ICs and/or one or more circuit boards of an electronic device, such as a laptop computer, a camera, a tablet computer, a mobile phone, a smart appliance, a gaming console, a desktop computer, an access point, an automotive system, an instrumentation system, or another suitable electronic device. In FIG. 1, the output of the pipeline processing unit 102 is provided to the comparison unit 104 and to the SAR ADC processing unit 106. The output of the comparison unit 104 and the output of the SAR ADC processing unit 106 (i.e., initial SAR MSB 118) are each provided to the summing unit 108. The output of the summing unit 108 (i.e., SAR ADC MSBs 120) is provided to the SAR ADC processing unit 106.

Figure 2:
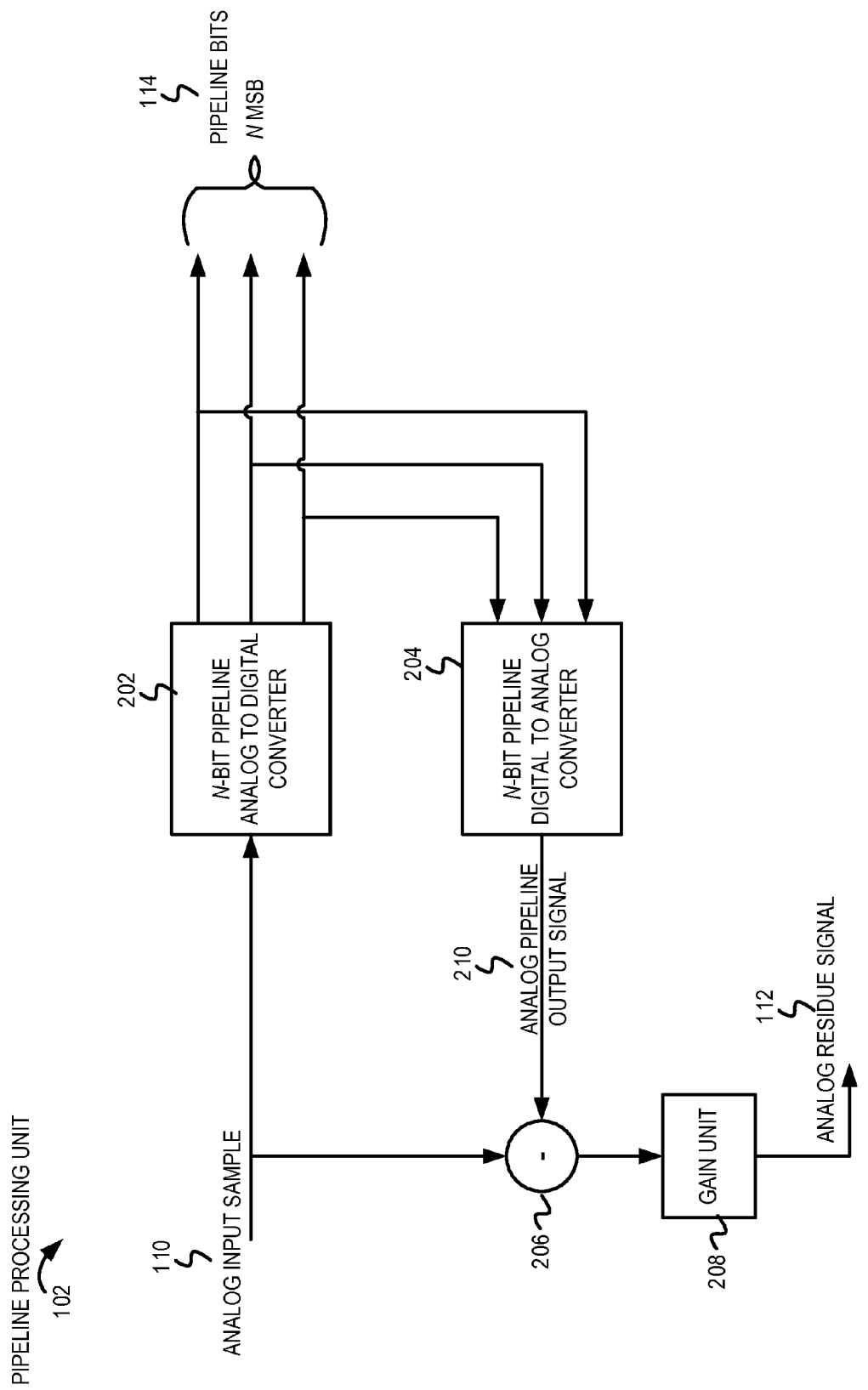
FIG. 2 is an example block diagram illustrating a pipeline processing unit.

At stage A, the pipeline processing unit 102 pre-processes an analog input sample 110 to determine a predetermined number of most significant bits ("pipeline bits") 114 of a digital representation of the analog input signal and to generate an analog residue signal 112. Although not depicted in FIG. 1, the analog input sample 110 can first be provided to a sampling unit. The sampling unit can determine a sample 110 of the analog input signal ("analog input sample") and can provide the analog input sample 110 to the pipeline processing unit 102. The pipeline processing unit 102 and the hybrid SAR ADC unit 124 can convert the analog input sample 110 into a corresponding digital representation, as will be further described below. FIG. 2 depicts an example configuration of the pipeline processing unit 102. The pipeline processing unit 102 comprises a pipeline analog-to-digital converter (ADC) 202, a pipeline digital-to-analog converter (DAC) 204, a subtractor 206, and a gain unit 208. The analog input sample 110 is provided to the pipeline ADC 202 and to the subtractor 206. The output of the pipeline ADC 202 is provided as an input to the pipeline DAC 204. The output of the pipeline DAC 204 is provided to the subtractor 206. The output of the subtractor 206 is provided to the gain unit 208. In one example, as depicted in FIG. 2, the pipeline ADC 202 is an N-bit analog-to-digital converter. In other words, the pipeline ADC 202 generates an N-bit digital representation of the analog input sample 110. In some implementations, the pipeline ADC 202 can be a flash ADC. In other implementations, the pipeline ADC 202 can execute other suitable techniques to determine N most significant bits (MSBs) of a digital representation of the analog input sample 110. These N MSBs generated by the pipeline ADC 202 are designated as the pipeline bits 114. In some implementations, the pipeline ADC 202 can comprise a predetermined number of comparators and the pipeline bits 114 can be indicative of the outputs of the predetermined number of comparators. For example, the pipeline ADC 202 may comprise six comparators. Each of the six comparators may be associated with a different comparator threshold. The analog input sample 110 may be compared against the comparator thresholds and each of the six comparators may generate an output depending on whether the analog input sample 110 exceeds the corresponding comparator threshold. For example, if the analog input sample 110 does not exceed any of the comparator thresholds, the pipeline bits 114 may be "000." As another example, if the analog input sample 110 exceeds all of the comparator thresholds, the pipeline bits 114 may be "111." In some implementations, the pipeline processing unit can be a 2.8 bit pipeline stage (e.g., when six comparators are used as described above). This means that the pipeline processing unit 102 can generate 2 pipeline bits that will be used as part of the digital representation of the analog input sample 110. The 0.8 bits can represent redundancy that is built into the output of the pipeline processing unit (e.g., for error correction, etc.). In other implementations, the pipeline processing unit can be a 1.5 bit pipeline stage.

The pipeline bits 114 at the output of the pipeline ADC 202 are provided as an input to the pipeline DAC 204. In one example as depicted in FIG. 2, the pipeline DAC 204 is an N-bit digital-to-analog converter. In other words, the pipeline DAC 204 generates an analog representation 210 of the N pipeline bits ("analog pipeline output signal"). The analog pipeline output signal 210 and the analog input sample 110 are provided as an input to the subtractor 206. The subtractor 206 subtracts the analog pipeline output signal 210 from the analog input sample 110. The gain unit 208 amplifies the resultant signal by a suitable amplification factor to yield the analog residue signal 112. It is noted that the output of the subtractor 206 may be amplified so that the analog residue signal 112 has the same full-scale range as the analog input sample 110 for easier processing and subsequent A/D conversion. The amplification factor can be determined based, at least in part, on the number of pipeline bits 114 generated by the pipeline ADC 202. Referring back to FIG. 1, the analog residue signal 112 is then provided to the hybrid SAR ADC processing unit 124.

Figure 3:
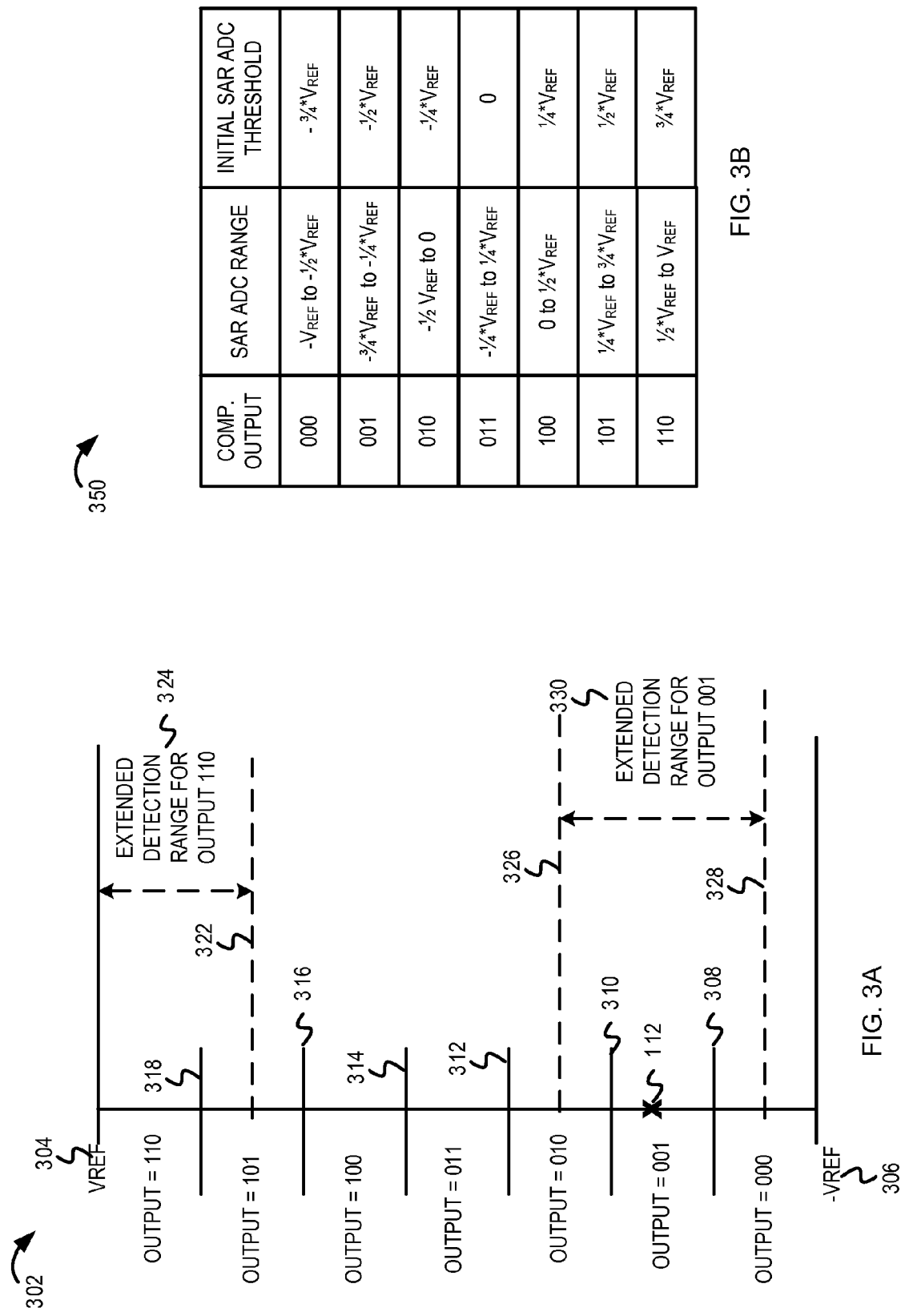
FIG. 3A is a graph illustrating an extended detection range associated with a comparator output.
FIG. 3B depicts an example listing of the comparator outputs, the corresponding SAR ADC ranges, and initial SAR ADC thresholds.

At stage B, the comparison unit 104 compares the analog residue signal 112 against one or more thresholds to determine one or more bits ("comparator bits") 116 that are a digital representation of the analog residue signal 112. The comparator bits 116 are then provided to the summing unit 108. FIG. 3A is a graph 302 illustrating an extended detection range associated with a comparator output of the comparison unit 104. As depicted by the graph 302, the full-scale range of the comparison unit 104 (and the signal processing unit 100) may be determined based on a predetermined reference voltage (for example, $2V_{ref}$) associated with the signal processing unit 100. In the example of FIG. 3A, the upper limit 304 of the full-scale range is $+V_{ref}$ while the lower limit 306 of the full-scale range is $-V_{ref}$. It is noted that in other examples, the upper limit of the full-scale range may be $2V_{ref}$ while the lower limit of the full-scale range may be 0. The graph 302 also depicts various thresholds associated with the comparison unit 104. In the example of FIG. 3A, the comparison unit 104 comprises six comparators and consequently, the comparison unit 104 is associated with six comparator thresholds 308, 310, 312, 314, 316, and 318 (one for each of the six comparators). It should be noted, however, that in other embodiments, the comparison unit 104 can comprise other suitable number of comparators and consequently can be associated with other suitable number of comparator thresholds. In FIG. 3A, the graph 302 also depicts one example where the analog residue signal 112 lies between the comparator thresholds 308 and 310.

The comparator output (i.e., the comparator bits 116 of the digital representation of the analog residue signal 112) can be determined based on identifying which of the comparators are triggered (i.e., based on identifying the comparator thresholds that the analog residue signal 112 exceeds). The comparison unit 104 generates the comparator output based on the analog residue signal 112 and the comparator thresholds 308, 310, 312, 314, 316, and 318. For example, if the analog residue signal 112 does not exceed any of the comparator thresholds, the comparator output may be "000." If the analog residue signal 112 exceeds the comparator threshold 308 and does not exceed the comparator threshold 310, the comparator output may be "001." The analog residue signal 112 can be compared against the comparator thresholds 308, 310,312, 314, 316, and 318. The outputs of the comparators associated with corresponding ones of the comparator thresholds 308, 310,312, 314, 316, and 318 can be analyzed. With reference to the example of FIG. 3A, it may be determined that the analog residue signal 112 only exceeds the comparator threshold 308. Typically, the accuracy of the digital representation of the analog residue signal 112 depends on the accuracy of the comparator thresholds 308, 310, 312, 314, 316, and 318. However, an accurate digital representation of the analog residue signal 112 can be obtained irrespective of the accuracy or the error margin of the comparator thresholds 308, 310, 312, 314, 316, and 318 by designating extended detection thresholds and corresponding extended detection ranges for each of the comparators of the comparison unit 104. It should be noted that the comparator thresholds 308, 310, 312, 314, 316, and 318 depicted in FIG. 3A are the ideal thresholds associated with the comparators. As will be further described below, the extended detection thresholds and corresponding extended detection ranges can be determined using the ideal comparator thresholds 308, 310, 312, 314, 316, and 318. In other words, even though the actual comparator thresholds may differ from the ideal comparator thresholds, the extended detection thresholds and corresponding extended detection ranges can be defined with respect to the ideal comparator thresholds so that the extended detection thresholds and ranges are fixed and are not governed by the accuracy of the comparators. For simplicity, FIG. 3A depicts the extended detection ranges for only some of the comparator outputs. In one example, the lower and upper limits of the extended detection range for a particular comparator output can be the midpoint of the original detection range associated with a preceding comparator output and a following comparator output. For example, the original detection range for the comparator output "110" extends from $V_{ref}$ 304 to the ideal comparator threshold 318. The preceding comparator output is "101" and the midpoint of the original detection range (that spans the ideal comparator thresholds 316 and 318) associated with the preceding comparator output "101" is the extended detection threshold 322. Thus, the extended detection range 324 for the comparator output "110" ranges from $V_{ref}$ 304 to the extended detection threshold 322. As another example, the original detection range for the comparator output "001" extends from the ideal comparator threshold 308 to the ideal comparator threshold 310. The preceding comparator output is "000" and the following comparator output is "010." The midpoint of the original detection range associated with the preceding comparator output "000" (i.e., the midpoint of the range that spans $-V_{ref}$ and the ideal comparator threshold 308) is the extended detection threshold 328. The midpoint of the original detection range associated with the following comparator output "010" (i.e., the midpoint of the range that spans the ideal comparator thresholds 310 and 312) is the extended detection threshold 326. Thus, the extended detection range 330 for the comparator output "001" ranges from the extended detection threshold 328 to the extended detection threshold 326. As will be described further below, after the comparison unit 104 generates the comparator output based on the analog residue signal 112 and the comparator thresholds 308, 310, 312, 314, 316, and 318, the comparison unit 104 can determine the extended ranges (also referred to as "SAR ADC range") associated with the comparator output and a corresponding initial SAR ADC threshold. The comparison unit 104 can provide the SAR ADC range and the corresponding initial SAR ADC threshold associated with the comparator output to the SAR ADC processing unit 106. FIG. 3B depicts a table 350 comprising an example listing of the comparator outputs, the corresponding SAR ADC ranges, and initial SAR ADC thresholds. In this example, the initial SAR ADC threshold is the midpoint of the corresponding SAR ADC range (i.e., the extended detection range associated with the comparator output). With reference to the example of FIG. 3A, the analog residue signal 112 lies between the comparator thresholds 308 and 310. Therefore, the comparison unit 104 generates a comparator output of "001" (i.e., the comparator bits are 001). The comparison unit 104 provides these comparator bits to the SAR ADC processing unit 106. Additionally, the comparison unit 104 also determines (e.g., based on the table 350 of FIG. 3B), that the SAR ADC range associated with the comparator output "001" is $-\frac{3}{4}V_{ref}$ to $-\frac{1}{4}V_{ref}$ and that the initial SAR ADC threshold is $-\frac{1}{2}V_{ref}$. The comparison unit 104 can provide the SAR ADC range and the initial SAR ADC threshold to the SAR ADC processing unit 106. It is noted, however, that in other implementations, the comparison unit 104 may not determine and provide the SAR ADC range and the initial SAR ADC threshold to the SAR ADC processing unit 106. Instead, in response to receiving the comparator bits "001" from the comparison unit 104, the SAR ADC processing unit 106 may access the table 350 and determine the SAR ADC range and the initial SAR ADC threshold associated with the received comparator bits.

At stage C, the SAR ADC processing unit 106 executes successive approximation operations to determine one or more bits ("SAR ADC bits") of the analog residue signal 112. The SAR ADC processing unit 106 can use the SAR ADC range and the initial SAR threshold (determined at stage B) to determine the SAR ADC bits. In one embodiment, the initial SAR threshold is the midpoint of the SAR ADC range. The SAR ADC processing unit 106 can compare the analog residue signal 112 against the initial SAR threshold and can determine whether the analog residue signal 112 lies above or below the initial SAR threshold. In one example, if the analog residue signal 112 lies above the initial SAR threshold, the SAR ADC processing unit 106 can indicate that the MSB of the SAR ADC bits is 1. If the analog residue signal 112 lies below the initial SAR threshold, the SAR ADC processing unit 106 can indicate that the MSB of the SAR ADC bits is 0. In the next iteration, if the analog residue signal 112 lies above the initial SAR threshold, the SAR ADC processing unit 106 can select the range between the initial SAR threshold and the upper limit of the initial SAR ADC range as the new SAR ADC range. The new SAR threshold can be is the midpoint of the new SAR ADC range. The SAR ADC processing unit 106 can compare the analog residue signal 112 against the new SAR ADC threshold to find the second MSB of the SAR ADC bits. The SAR ADC processing unit 106 can successively execute these operations until the requisite bit resolution is achieved (e.g., until a predetermined number of SAR ADC bits are determined).

At stage D, the summing unit 108 adds an initial SAR MSB 118 with the comparator bits 116 to determine a predetermined number of SAR ADC MSBs 120 of the SAR output bits. The SAR ADC processing unit 106 can provide a most significant bit of the SAR ADC bits ("initial SAR MSB") 118 to the summing unit 108. The summing unit 108 can add the initial SAR MSB 118 with the comparator bits 116 (determined at stage C). As a result, the summing unit 108 can generate one or more most significant SAR ADC output bits 120, as described below in block 516 of FIG. 6. In other words, the most significant SAR ADC output bits 120 are the sum of the comparator bits 116 and the initial SAR MSB 118. The remainder of the SAR ADC bits (that do not include the initial SAR MSB 118) can be designated as least significant SAR ADC bits. The combination of the most significant SAR ADC bits 120 and the least significant SAR ADC bits (that do not comprise the initial SAR MSB 118) are herein referred to as the SAR output bits 122. In one example, the pipeline processing unit 102 may be a 2.8 bit pipeline stage and may generate 2 pipeline bits (with a 0.8 bit redundancy). The SAR ADC processing unit 106 (in conjunction with the comparison unit 104) may generate 9 SAR output bits. The pipeline bits 114 may be combined with the SAR output bits 122 to generate the digital representation of the analog input signal ("digital output signal"). It is noted that in some embodiments, the most significant SAR ADC bits 120 and the least significant SAR ADC bits can be concatenated to yield the SAR output bits 122. Furthermore, the pipeline bits 114 can be concatenated with the SAR output bits 122 to yield the digital output signal. In other embodiments, other suitable combination techniques can be used to generate the digital output signal from the most significant SAR ADC bits 120, the least significant SAR ADC bits, and the pipeline bits 114. It is noted that the pipeline bits 114 may be the most significant bits of the digital output signal, while the SAR output bits 122 may be the least significant bits of the digital output signal.

In some implementations, as depicted in FIG. 1, the pipeline processing unit 102 may be implemented separately from the hybrid SAR ADC unit 124. In other words, the pipeline processing unit 102 may comprise one set of comparators for determining the pipeline bits and the hybrid SAR ADC unit 124 may comprise another distinct set of comparators (i.e., of the comparison unit 104) for determining the comparator bits. In other implementations, as will be described with reference to FIG. 4, the pipeline processing unit 102 may be part of the hybrid SAR ADC unit 124. As will be further described below, the comparators of the pipeline processing unit 102 can be leveraged twice—once to determine the pipeline bits from the analog input sample 110 and again to determine the comparator bits from the analog residue signal 112.

Figure 4:
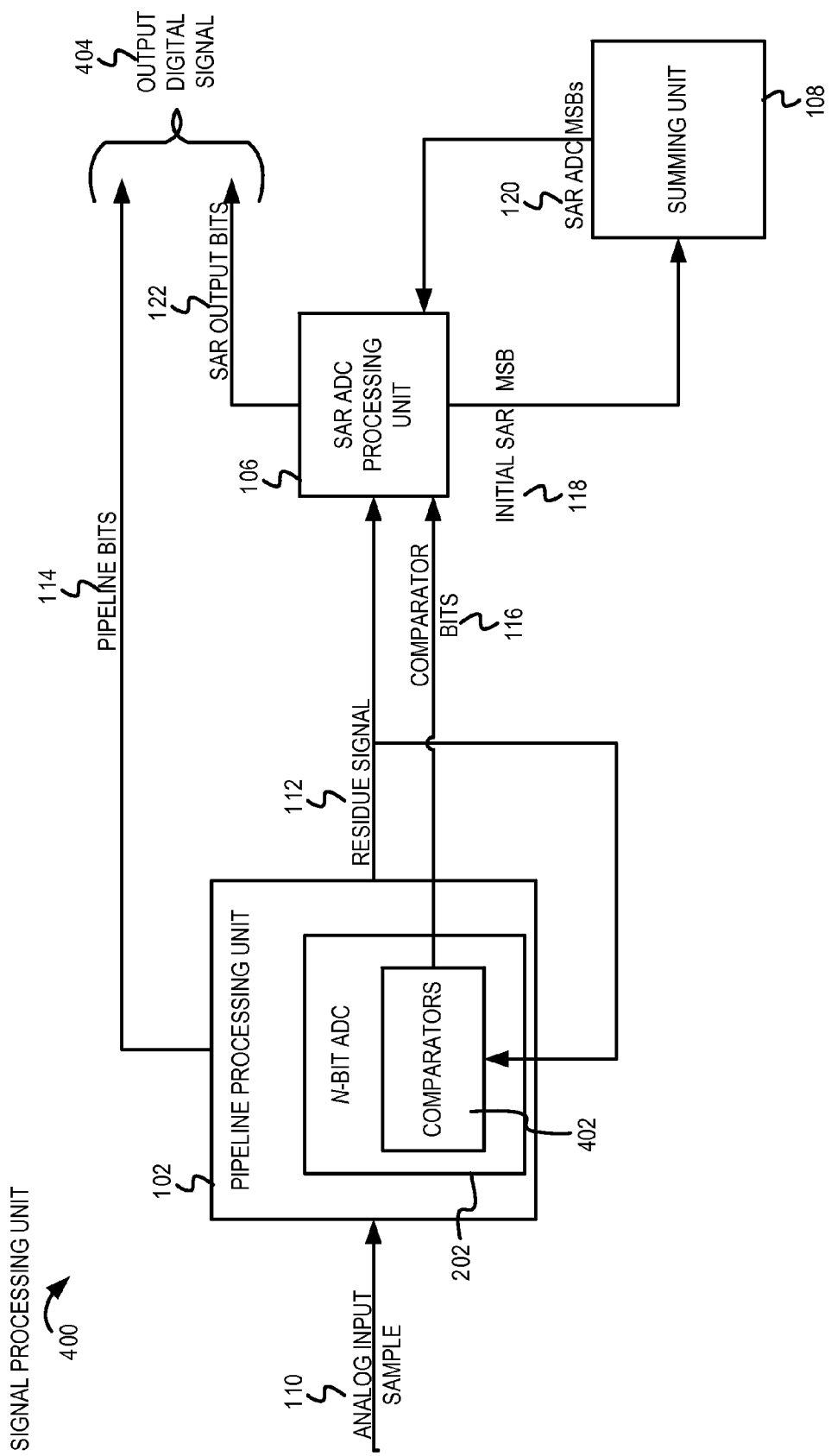
FIG. 4 is a block diagram illustrating another embodiment of an ADC process including a hybrid SAR ADC mechanism.

FIG. 4 is a block diagram illustrating another embodiment of a hybrid SAR ADC. FIG. 4 depicts a signal processing unit 400 comprising the pipeline processing unit 102, the SAR ADC processing unit 106, and the summing unit 108 as depicted in FIG. 1. As depicted with reference to FIG. 2, the pipeline processing unit 102 comprises an N-bit pipeline ADC 202. The N-bit pipeline ADC 202 comprises a predetermined number of comparators 402. As will be further described in FIG. 4, in this embodiment, the comparators 402 of the pipeline processing unit 102 are utilized twice—once to generate the pipeline bits 114 from the analog input sample 110 and again to generate the comparator bits 116 from the analog residue signal 112. In the example of FIG. 4, the comparators 402 first compare the analog input sample 110 against corresponding thresholds to generate the pipeline bits 114, as described above in stage A of FIG. 1. After the pipeline processing unit 102 generates the analog residue signal 112 (and the pipeline bits 114), the analog residue signal 112 is provided to the SAR ADC processing unit 106. Additionally, the analog residue signal 112 is also fed back to the comparators 402 of the pipeline processing unit 102. The comparators 402 can again compare the analog residue signal 112 against the corresponding comparator thresholds to determine the comparators bits 116, as described above with reference to stage B of FIG. 1. The comparators 402 can then provide the comparator bits 116 to the SAR ADC processing unit 106. The SAR ADC processing unit 106 can determine the SAR output bits 122 based, at least in part, on the comparator bits 116 and the analog residue signal 112, as described above in stages C and D of FIG. 1. Re-using the comparators 402 of the pipeline processing unit 102 to determine the comparators bits 116 as described above in FIG. 4 can minimize the hardware utilized for implementing the hybrid SAR ADC.

Figure 5:
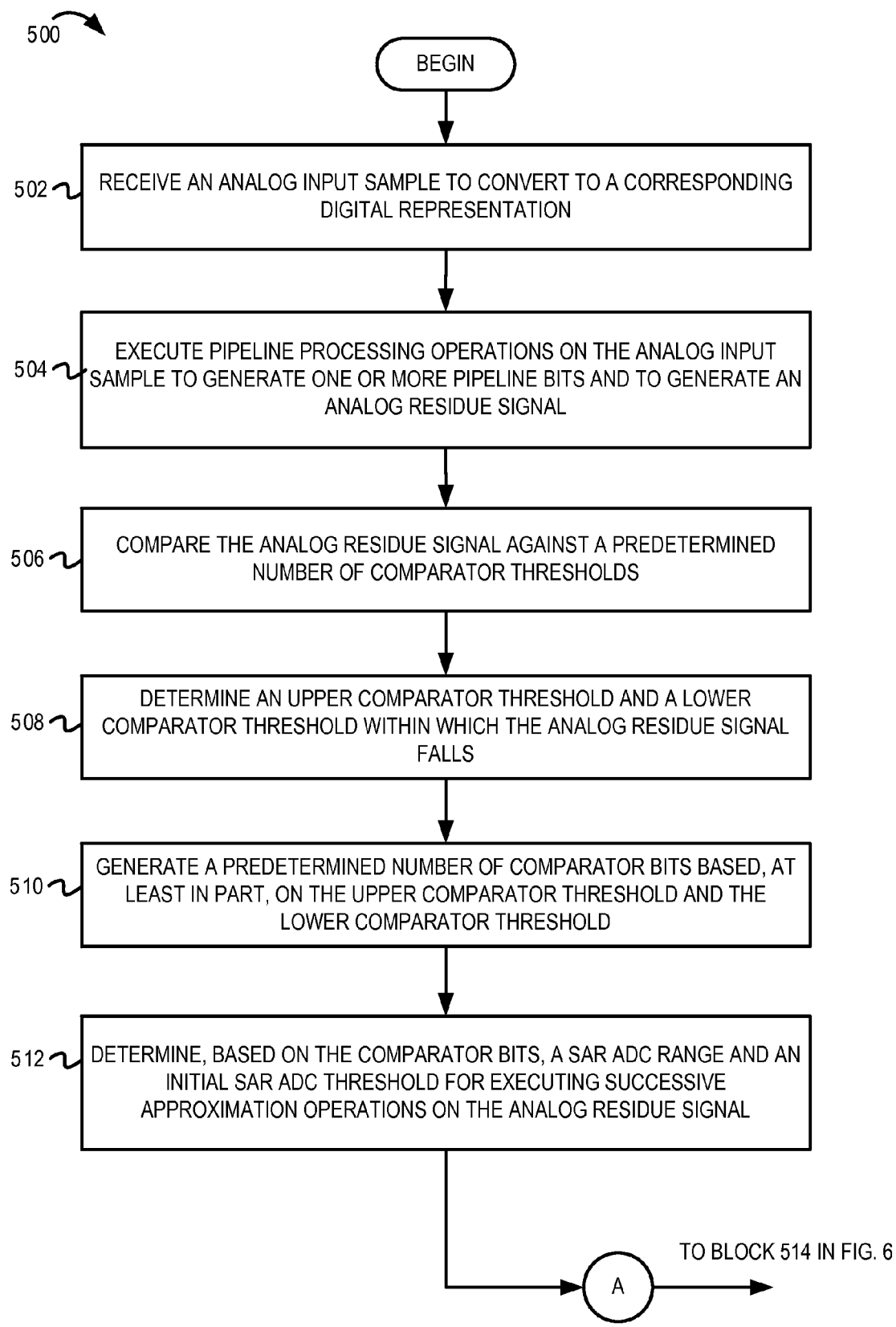
FIG. 5 is a flow diagram illustrating example operations of a hybrid SAR ADC mechanism.
Figure 6:
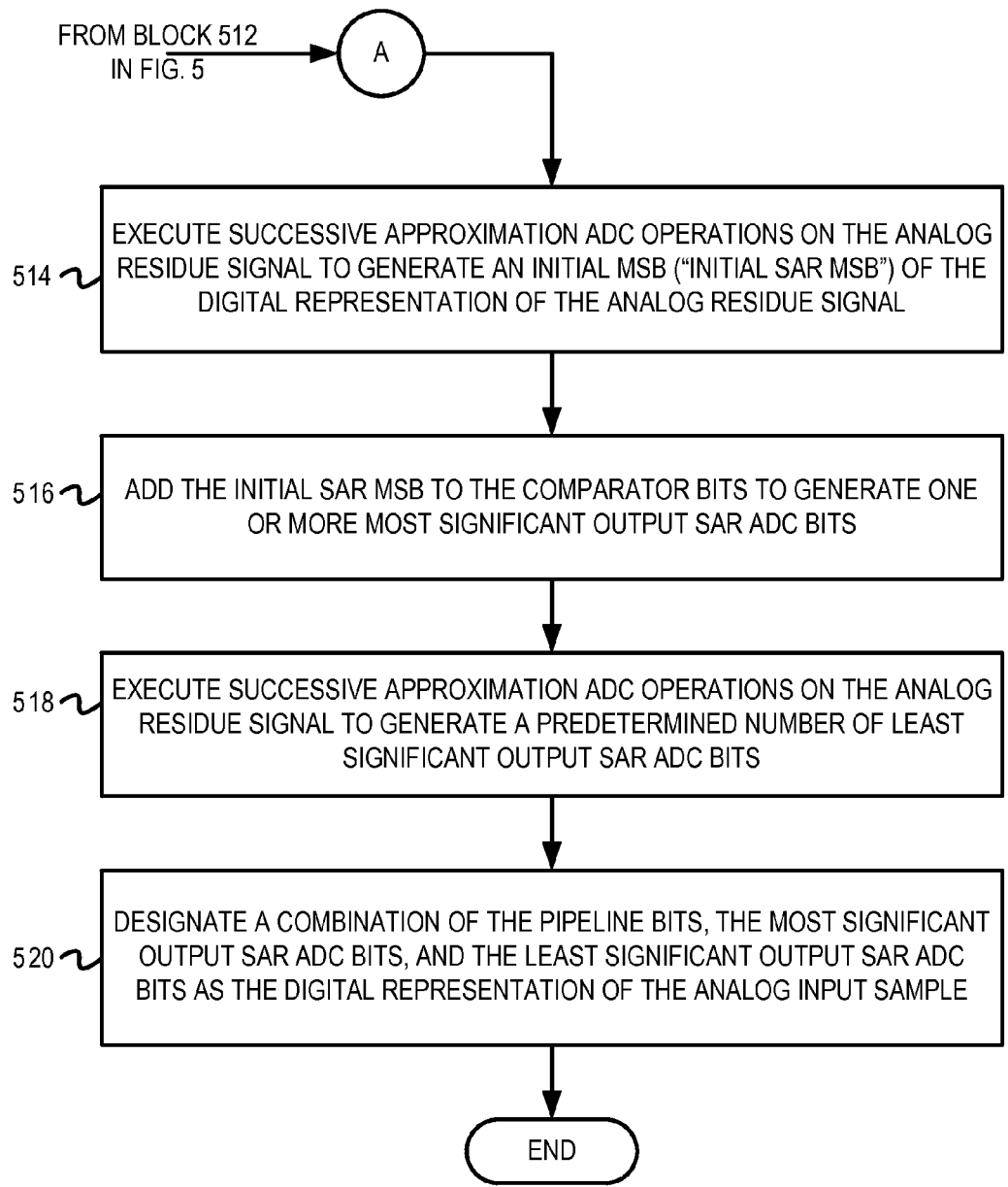
FIG. 6 is a continuation of FIG. 5 and also illustrates example operations of the hybrid SAR ADC mechanism.

FIG. 5 and FIG. 6 depict a flow diagram ("flow") 500 illustrating example operations of a hybrid SAR ADC mechanism. The flow 500 begins at block 502 in FIG. 5.

At block 502, an analog input signal to be converted into a corresponding digital output signal is received. With reference to the example of FIG. 1, a sampling unit (not shown) may receive the analog input signal and may determine a sample of the analog input signal. The sampling unit may provide the analog input sample 110 to the pipeline processing unit 102. It is noted that in other implementations, the hybrid SAR ADC unit 124 may receive the analog input sample 110 (in the absence of a pipeline processing unit) that is to be converted into a digital output signal. The analog input sample 110 can be converted into its corresponding digital representation, as will be further described below. The flow continues at block 504.

At block 504, pipeline processing operations are executed on the analog input sample to generate one or more pipeline bits and to generate an analog residue signal. For example, the pipeline processing unit 102 can execute pipeline processing operations described above with reference to FIGS. 1 and 2 to generate the one or more pipeline bits 114. The pipeline bits 114 are the most significant bits of the digital representation of the analog input sample 110. As described above with reference to FIG. 2, the pipeline processing unit 102 can subtract an analog representation of the pipeline bits (i.e., the analog pipeline output signal 210 of FIG. 2) from the analog input sample 110 to yield the analog residue signal 112. The pipeline processing unit 102 can then provide the analog residue signal 112 for subsequent processing by the hybrid SAR ADC unit 124. The flow continues at block 506.

At block 506, the analog residue signal is compared against a predetermined number of comparator thresholds. For example, the comparison unit 104 of FIG. 1 can compare the analog residue signal 112 against the predetermined number of comparator thresholds associated with the comparison unit 104. As described above with reference to FIGS. 1, 3A, and 3B, the comparison unit 104 can comprise a predetermined number of comparators. In some implementations, these comparators can be the comparators 402 of the pipeline processing unit 102 that were used to determine the pipeline bits 114 at block 504. In other implementations, the comparators employed at block 506 can be distinct from the comparators 402 of the pipeline processing unit 102. Each of the comparators of the comparison unit 104 may be associated with a corresponding distinct comparator threshold. As described above with reference to FIG. 3A, the analog residue signal 112 is compared against the comparator thresholds 308, 310, 312, 314, 316, and 318 to identify which (if any) of the comparator thresholds are exceeded by the analog residue signal. The flow continues at block 508.

At block 508, an upper comparator threshold and a lower comparator threshold within which the analog residue signal falls is determined. For example, the comparison unit 104 can determine the upper comparator threshold and the lower comparator threshold. With reference to FIG. 3A, after the analog residue signal 112 is compared against the comparator thresholds 308, 310, 312, 314, 316, and 318, it may be determined that the analog residue signal 112 lies within the range bound by the comparator thresholds 308 and 310. Accordingly, the comparator threshold 308 can be designated as the lower comparator threshold and the comparator threshold 310 can be designated as the upper comparator threshold. The flow continues at block 510.

At block 510, a predetermined number of comparator bits are generated based, at least in part, on the upper comparator threshold and the lower comparator threshold. For example, the comparison unit 104 can generate the predetermined number of comparator bits 116 based, at least in part, on the upper comparator threshold and the lower comparator threshold. Referring to FIG. 3A, it is determined that the comparator output associated with signals that lie within the range bounded by the comparator thresholds 308 and 310 is "010." Accordingly, the comparator bits 116 generated for the analog residue signal 112 are "010." As depicted with reference to FIG. 1, the comparator bits 116 and the analog residue signal 112 can be provided to the SAR ADC processing unit 106 for subsequent processing. The flow continues at block 512.

At block 512, a SAR ADC range and an initial SAR ADC threshold are determined for executing successive approximation ADC operations on the analog residue signal. In one implementation, the comparison unit 104 can determine the SAR ADC range and the initial SAR ADC threshold based, at least in part, on the comparator bits. In this implementation, the comparison unit 104 can provide the SAR ADC range and the initial SAR ADC threshold to the SAR ADC processing unit 106 (along with the comparator bits 116). In another implementation, the SAR ADC processing unit 106 can determine the SAR ADC range and the initial SAR ADC threshold based on the comparator bits 116 received from the comparison unit 104. In some implementations, the SAR ADC range and the initial SAR ADC threshold can be hardwired as part of the SAR ADC processing unit 106 (or the comparison unit 104). In another implementation, the SAR ADC range and the initial SAR ADC threshold can be stored in a predetermined memory location, configuration register(s), or a suitable data structure. As described above with reference to FIGS. 3A and 3B, the SAR ADC range can comprise an extended detection range associated with the comparator output. The SAR ADC processing unit 106 can use the extended detection range for executing successive approximation operations to account for any discrepancies and inaccuracies in the comparator thresholds 308, 310, 312, 314, 316, and 318. The initial SAR ADC threshold is typically the midpoint of the SAR ADC range and can be used to aid the SAR ADC processing unit 106 in executing binary search operations to determine the SAR ADC bits. With reference to FIG. 3B, if the comparator bits 116 are "011," the SAR ADC range may be $-\frac{1}{4}V_{ref}$ to $\frac{1}{4}V_{ref}$ and the initial SAR ADC threshold may be zero. The flow continues at block 514 in FIG. 6.

At block 514, successive approximation ADC operations are executed on the analog residue signal to generate an initial SAR MSB. For example, the SAR ADC processing unit 106 can generate the initial SAR MSB 118. In one implementation, the SAR ADC processing unit 106 can compare the analog residue signal 112 against the initial SAR ADC threshold (determined at block 512). If the analog residue signal 112 is less than the initial SAR ADC threshold, the initial SAR MSB 118 may be a bit at logic zero. If the analog residue signal 112 is greater than the initial SAR ADC threshold, the initial SAR MSB may be a bit at logic one. The flow continues at block 516.

At block 516, the initial SAR MSB is added to the comparator bits to generate one or more most significant output SAR ADC bits. For example, the summing unit 108 can add the initial SAR MSB 118 to the comparator bits 116 to generate one or more most significant output SAR ADC bits 120. In some embodiments, the summing unit 108 can use binary arithmetic to add the initial SAR MSB 118 to the comparator bits 116.

For example, the comparator bits "010" can be added to the initial SAR MSB "1" to yield the most significant output SAR ADC bits "011" (i.e., 010+1=011). As another example, the comparator bits "011" can be added to the initial SAR MSB "1" to yield the most significant output SAR ADC bits "100" (i.e., 011+1=100). It should be noted that in other embodiments, the summing unit 108 can use arithmetic in other suitable numeral systems to add the initial SAR MSB 118 to the comparator bits 116. The flow continues at block 518.

At block 518, successive approximation ADC operations are further executed on the analog residue signal to generate a predetermined number of least significant output SAR ADC bits. For example, after the SAR ADC processing unit 106 generates the initial SAR MSB 118, the SAR ADC processing unit 106 can continue to execute successive approximation operations on the analog residue signal 112 to generate the predetermined number of least significant output SAR ADC bits. In FIG. 1, a combination of the most significant SAR ADC bits (determined at block 516) and the least significant SAR ADC bits (determined at block 518) are designated as the SAR output bits 122. In one example, the most significant SAR ADC bits and the least significant SAR ADC bits can be concatenated to yield the SAR output bits 122. The flow continues at block 520.

At block 520, a combination of the one or more pipeline bits, the most significant SAR ADC output bits, and the least significant output SAR ADC bits are designated as the digital representation of the analog input sample. For example, the hybrid SAR ADC unit 124 (or the signal processing unit 100) may generate the digital output signal as a combination of the pipeline bits (determined at block 502), the most significant SAR ADC output bits (determined at block 516), and the least significant output SAR ADC bit (determined at block 518). In one example, the most significant SAR ADC bits, the least significant SAR ADC bits, and the pipeline bits can be concatenated to yield the digital representation of the analog input sample. From block 520, the flow ends.

It should be understood that FIGS. 1-6 are examples meant to aid in understanding embodiments and should not be used to limit embodiments or limit scope of the claims. Embodiments may comprise additional circuit components, different number of components (e.g., different number of comparators), different circuit components, and/or may perform additional operations, fewer operations, operations in a different order, operations in parallel, and some operations differently. Although FIGS. 1-6 depict the analog input sample 110 being pre-processed by a pipeline processing unit 102 to generate one or more pipeline bits 114, embodiments are not so limited. In other embodiments, the analog input sample 110 may not be pre-processed by the pipeline processing unit 102. Instead, the analog input sample 110 may be directly provided as an input to the hybrid SAR ADC unit 124. The SAR ADC processing unit 106 in conjunction with the comparison unit 104 can determine the digital representation of the analog input sample 110 as described above. For example, with reference to FIG. 1, the analog input sample 110 may be directly provided to the SAR ADC processing unit 106 and to the comparison unit 104. As described above in FIGS. 1-6, the comparison unit 104 can generate the comparator bits 116 based on the analog input sample 110. The SAR ADC processing unit 106 can generate an initial SAR MSB 118 based on the analog input sample 110. The summing unit 108 can add the comparator bits 116 with the initial SAR MSB 118 to determine the SAR ADC MSBs 120. The SAR ADC processing unit 106 can continue to generate the SAR ADC LSBs from the analog input sample 110 and can combine the SAR ADC MSBs 120 with the SAR ADC LSBs to generate the digital representation of the analog input sample 110.

It should be noted that the comparator thresholds 308, 310, 312, 314, 316, and 318 described above in FIGS. 1-6 may be the ideal thresholds associated with the comparators. Thus, the extended detection thresholds and corresponding extended detection ranges can be determined using the ideal comparator thresholds 308, 310, 312, 314, 316, and 318 so that the extended detection thresholds and ranges are fixed and are not governed by the accuracy of the comparators (e.g., the differences between the actual comparator thresholds and the ideal comparator thresholds). It should be noted that although FIGS. 1-6 describe the lower and upper limits of the extended detection range for a particular comparator output as the midpoint of the original detection range associated with a preceding comparator output and a following comparator output respectively, embodiments are not so limited. In other embodiments, the extended detection range for a particular comparator output could span from any suitable point of the original detection range (that spans appropriate ideal comparator thresholds) associated with the preceding comparator output to any suitable point of the original detection range (that spans appropriate ideal comparator thresholds) associated with the following comparator output. For example, the extended detection range for the comparator output "001" can span from any suitable point of the original detection range (i.e., that spans $-V_{ref}$ and the ideal comparator threshold 308) associated with the preceding comparator output "000" to any suitable point of the original detection range (i.e., that spans the ideal comparator thresholds 310 and 312) associated with the following comparator output "010".

Embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein. A machine-readable medium includes any mechanism for storing ("machine-readable storage medium") or transmitting ("machine-readable signal medium") information in a form (e.g., software, processing application) readable by a machine (e.g., a computer). The machine-readable storage medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions (e.g., executable by one or more processing units). In addition, machine-readable signal medium embodiments may be embodied in an electrical, optical, acoustical or other form of propagated signal (e.g., carrier waves, infrared signals, digital signals, etc.), or wireline, wireless, or other communications medium.

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

Figure 7:
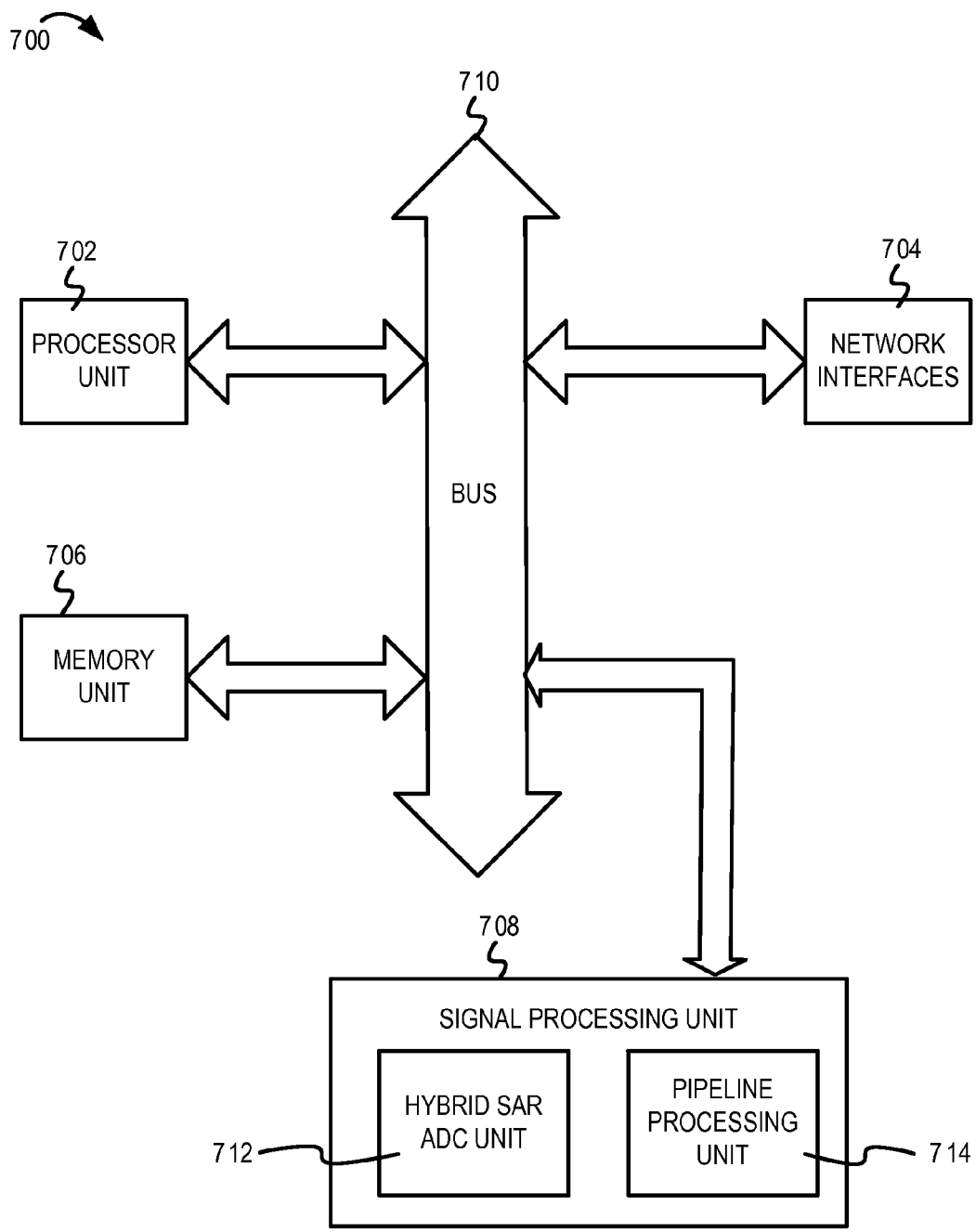
FIG. 7 is a block diagram of one embodiment of an electronic device including a hybrid successive approximation ADC mechanism.

FIG. 7 is a block diagram of one embodiment of an electronic device 700 including a hybrid successive approximation ADC mechanism. In some implementations, the electronic device 700 may be one of a notebook computer, a desktop computer, a tablet computer, a netbook, a mobile phone, a gaming console, a personal digital assistant (PDA), an instrumentation device, or other electronic systems with one or more signal processing chains. The electronic device 700 includes a processor unit 702 (possibly including multiple processors, multiple cores, multiple nodes, and/or implementing multi-threading, etc.). The electronic device 700 includes a memory unit 706. The memory unit 706 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. In some embodiments, the electronic device 700 may also include a bus 710 (e.g., PCI, ISA, PCI-Express, HyperTransport®, InfiniBand®, NuBus, AHB, AXI, etc.), and one or more network interfaces 704. In one example, if the electronic device is a communication device, the electronic device may include at least one of a wireless network interface (e.g., a WLAN interface, a Bluetooth® interface, a WiMAX interface, a ZigBee® interface, a Wireless USB interface, etc.) and a wired network interface (e.g., an Ethernet interface, etc.).

The electronic device 700 also includes a signal processing unit 708. The signal processing unit 708 may be included in one or more ICs and one or more circuit boards of the electronic device 700. For example, the signal processing unit 708 may be implemented within a communication unit (e.g., a system-on-a-chip that implements wired and/or wireless communications) of the electronic device 700. The signal processing unit 708 comprises a hybrid SAR ADC unit 712 and a pipeline processing unit 714. The signal processing unit 708 can execute functionality for determining a digital representation of an analog input signal, as is further described above with reference to FIGS. 1-6. Any one of these functionalities may be partially (or entirely) implemented in hardware and/or on the processor unit 702. For example, the functionality may be implemented with an application specific integrated circuit, in logic implemented in the processor unit 702, in a co-processor on a peripheral device or card, etc. Further, realizations may include fewer or additional components not illustrated in FIG. 7 (e.g., video cards, audio cards, additional network interfaces, peripheral devices, etc.). The processor unit 702, the memory unit 706, and the network interfaces 704 are coupled to the bus 710. Although illustrated as being coupled to the bus 710, the memory unit 706 may be coupled to the processor unit 702.

While the embodiments are described with reference to various implementations and exploitations, it will be understood that these embodiments are illustrative and that the scope of the inventive subject matter is not limited to them. In general, techniques for a hybrid successive approximation analog-to-digital converter as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   executing pipeline processing operations on an analog input signal to generate one or more pipeline bits and an analog residue signal in response to receiving, at a signal processing device, the analog input signal to be converted to a corresponding digital output signal, wherein the one or more pipeline bits are most significant bits of the digital output signal;
   comparing the analog residue signal against a plurality of predetermined thresholds to generate one or more comparator bits that are indicative of a range associated with a subset of the predetermined thresholds that correspond to the analog residue signal;
   executing successive approximation analog-to-digital conversion operations on the analog residue signal to generate a plurality of successive approximation bits; and
   determining the digital output signal based, at least in part, on the one or more pipeline bits, the one or more comparator bits, and the plurality of successive approximation bits.

2. The method of claim 1, wherein said determining the digital output signal based, at least in part, on the one or more pipeline bits, the one or more comparator bits, and the plurality of successive approximation bits comprises:
   determining a first of the plurality of successive approximation bits that is a most significant bit of the plurality of successive approximation bits;
   adding the first of the plurality of the successive approximation bits to the one or more comparator bits to yield one or more most significant successive approximation output bits;
   designating remainder of the plurality of the successive approximation bits that do not comprise the first of the plurality of the successive approximation bits as least significant successive approximation output bits; and
   combining the one or more pipeline bits, the one or more most significant successive approximation output bits, and the least significant successive approximation output bits to yield the digital output signal.

3. The method of claim 2, wherein said combining the one or more pipeline bits, the one or more most significant successive approximation output bits, and the least significant successive approximation output bits to yield the digital output signal comprises:
   concatenating the one or more pipeline bits, the one or more most significant successive approximation output bits, and the least significant successive approximation output bits to yield the digital output signal.

4. The method of claim 1, wherein said executing the pipeline processing operations on the analog input signal to generate the one or more pipeline bits and the analog residue signal further comprises:
   executing analog-to-digital conversion operations on the analog input signal to generate the one or more pipeline bits;
   executing digital-to-analog conversion operations on the one or more pipeline bits to determine an analog representation of the one or more pipeline bits; and
   subtracting the analog representation of the one or more pipeline bits from the analog input signal to generate the analog residue signal.

5. The method of claim 4, wherein said executing the analog-to-digital conversion operations on the analog input signal to generate the one or more pipeline bits comprises:
   receiving the analog input signal at a pipeline analog-to-digital converter, wherein the pipeline analog-to-digital converter comprises a plurality of comparators associated with respective ones of the plurality of predetermined thresholds; and
   comparing the analog input signal against the plurality of predetermined thresholds to generate the one or more pipeline bits.

6. The method of claim 5, wherein the analog residue signal is fed back to the plurality of comparators of the pipeline analog-to-digital converter to generate the one or more comparator bits.

7. The method of claim 5, wherein the analog residue signal is provided to a second plurality of comparators associated with respective ones of a second plurality of predetermined thresholds to generate the one or more comparator bits.

8. The method of claim 1, wherein said comparing the analog residue signal against the plurality of predetermined thresholds to generate one or more comparator bits comprises:
- determining that the analog residue signal lies within a current range bounded by a first of the plurality of predetermined thresholds and a second of the plurality of predetermined thresholds; and
- identifying the one or more comparator bits based, at least in part, on the current range bounded by the first of the plurality of predetermined thresholds and the second of the plurality of predetermined thresholds.

9. The method of claim 8, wherein said executing successive approximation analog-to-digital conversion operations on the analog residue signal to generate the plurality of successive approximation bits comprises:
- determining, based on the one or more comparator bits, an extended detection range and an initial detection threshold; and
- executing the successive approximation analog-to-digital conversion operations on the analog residue signal to generate the plurality of successive approximation bits based, at least in part, on the extended detection range and the initial detection threshold.

10. The method of claim 9, wherein if the first of the plurality of predetermined thresholds is a lower limit associated with the current range and the second of the plurality of predetermined thresholds is an upper limit associated with the current range, said determining the extended detection range and the initial detection threshold comprises:
- identifying a first range that precedes the current range, wherein the first of the plurality of predetermined thresholds is an upper limit associated with the first range and a third of the plurality of predetermined thresholds is a lower limit associated with the first range;
- identifying a second range that follows the current range, wherein the second of the plurality of predetermined thresholds is a lower limit associated with the second range and a fourth of the plurality of predetermined thresholds is an upper limit associated with the second range;
- selecting the extended detection range associated with the one or more comparator bits to extend from a midpoint of the first range that precedes the current range to a midpoint of the second range that follows the current range; and
- selecting the initial detection threshold associated with the one or more comparator bits as a midpoint of the extended detection range.

11. A method comprising:
- detecting, at a successive approximation analog-to-digital converter (SAR ADC) of a signal processing device, an analog input signal received at the signal processing device that is to be converted into a corresponding digital output signal;
- comparing the analog input signal against a plurality of predetermined thresholds to generate one or more comparator bits that are indicative of a range associated with a subset of the predetermined thresholds that correspond to the analog input signal;
- executing successive approximation analog-to-digital conversion operations on the analog input signal to generate a plurality of successive approximation bits; and
- determining the digital output signal based, at least in part, on the one or more comparator bits and the plurality of successive approximation bits.

12. The method of claim 11, wherein said determining the digital output signal based, at least in part, on the one or more comparator bits and the plurality of successive approximation bits comprises:
- determining a first of the plurality of successive approximation bits that is a most significant bit of the plurality of successive approximation bits;
- adding the first of the plurality of the successive approximation bits to the one or more comparator bits to yield one or more most significant successive approximation output bits; and
- combining the one or more most significant successive approximation output bits and remainder of the plurality of the successive approximation bits that do not comprise the first of the plurality of the successive approximation bits to yield the digital output signal.

13. The method of claim 12, wherein said combining the one or more most significant successive approximation output bits and remainder of the plurality of the successive approximation bits that do not comprise the first of the plurality of the successive approximation bits to yield the digital output signal comprises:
- concatenating the one or more most significant successive approximation output bits and remainder of the plurality of the successive approximation bits that do not comprise the first of the plurality of the successive approximation bits to yield the digital output signal.

14. The method of claim 11, wherein said executing successive approximation analog-to-digital conversion operations on the analog residue signal to generate the plurality of successive approximation bits comprises:
- determining, based on the one or more comparator bits, an extended detection range and an initial detection threshold; and
- executing the successive approximation analog-to-digital conversion operations on the analog residue signal to generate the plurality of successive approximation bits based, at least in part, on the extended detection range and the initial detection threshold.

15. The method of claim 11, further comprising:
- executing pipeline processing operations on a first analog signal to generate one or more pipeline bits and the analog input signal, wherein the one or more pipeline bits are most significant bits of the digital output signal.

16. The method of claim 15, wherein said determining digital output signal based, at least in part, on the one or more pipeline bits, the one or more comparator bits, and the plurality of successive approximation bits comprises:
- determining a first of the plurality of successive approximation bits that is a most significant bit of the plurality of successive approximation bits;
- adding the first of the plurality of the successive approximation bits to the one or more comparator bits to yield one or more most significant successive approximation output bits;
- designating remainder of the plurality of the successive approximation bits that do not comprise the first of the plurality of the successive approximation bits as least significant successive approximation output bits; and
- combining the one or more pipeline bits, the one or more most significant successive approximation output bits, and the least significant successive approximation output bits to yield the digital output signal.

17. One or more machine-readable storage media having instructions stored therein, which when executed by one or more processors causes the one or more processors to perform operations that comprise:

executing pipeline processing operations on an analog input signal to generate one or more pipeline bits and an analog residue signal in response to receiving the analog input signal to be converted to a corresponding digital output signal, wherein the one or more pipeline bits are most significant bits of the digital output signal;

comparing the analog residue signal against a plurality of predetermined thresholds to generate one or more comparator bits that are indicative of a range associated with a subset of the predetermined thresholds that correspond to the analog residue signal;

executing successive approximation analog-to-digital conversion operations on the analog residue signal to generate a plurality of successive approximation bits; and determining the digital output signal based, at least in part, on the one or more pipeline bits, the one or more comparator bits, and the plurality of successive approximation bits.

18. The machine-readable storage media of claim 17, wherein said operation of determining the digital output signal based, at least in part, on the one or more pipeline bits, the one or more comparator bits, and the plurality of successive approximation bits comprises:

determining a first of the plurality of successive approximation bits that is a most significant bit of the plurality of successive approximation bits;

adding the first of the plurality of the successive approximation bits to the one or more comparator bits to yield one or more most significant successive approximation output bits;

designating remainder of the plurality of the successive approximation bits that do not comprise the first of the plurality of the successive approximation bits as least significant successive approximation output bits; and combining the one or more pipeline bits, the one or more most significant successive approximation output bits, and the least significant successive approximation output bits to yield the digital output signal.

19. The machine-readable storage media of claim 17, wherein said operation of executing the pipeline processing operations on the analog input signal to generate the one or more pipeline bits and the analog residue signal further comprises:

receiving the analog input signal at a pipeline analog-to-digital converter, wherein the pipeline analog-to-digital converter comprises a plurality of comparators associated with respective ones of the plurality of predetermined thresholds;

comparing the analog input signal against the plurality of predetermined thresholds to generate the one or more pipeline bits;

executing digital-to-analog conversion operations on the one or more pipeline bits to determine an analog representation of the one or more pipeline bits; and subtracting the analog representation of the one or more pipeline bits from the analog input signal to generate the analog residue signal.

20. The machine-readable storage media of claim 19, wherein the analog residue signal is fed back to the plurality of comparators of the pipeline analog-to-digital converter to generate the one or more comparator bits.

21. The machine-readable storage media of claim 19, wherein the analog residue signal is provided to a second plurality of comparators associated with respective ones of a second plurality of predetermined thresholds to generate the one or more comparator bits.

22. The machine-readable storage media of claim 17, wherein said operation of comparing the analog residue signal against the plurality of predetermined thresholds to generate one or more comparator bits comprises:

determining that the analog residue signal lies within a current range bounded by a first of the plurality of predetermined thresholds and a second of the plurality of predetermined thresholds; and identifying the one or more comparator bits based, at least in part, on the current range bounded by the first of the plurality of predetermined thresholds and the second of the plurality of predetermined thresholds; and wherein said operation of executing successive approximation analog-to-digital conversion operations on the analog residue signal to generate the plurality of successive approximation bits comprises:

determining, based on the one or more comparator bits, an extended detection range and an initial detection threshold; and executing the successive approximation analog-to-digital conversion operations on the analog residue signal to generate the plurality of successive approximation bits based, at least in part, on the extended detection range and the initial detection threshold.

23. An electronic device comprising:

a processor; and a signal processing unit coupled with the processor, the signal processing unit operable to:

execute pipeline processing operations on an analog input signal to generate one or more pipeline bits and an analog residue signal in response to the signal processing unit receiving the analog input signal to be converted to a corresponding digital output signal, wherein the one or more pipeline bits are most significant bits of the digital output signal;

compare the analog residue signal against a plurality of predetermined thresholds to generate one or more comparator bits that are indicative of a range associated with a subset of the predetermined thresholds that correspond to the analog residue signal;

execute successive approximation analog-to-digital conversion operations on the analog residue signal to generate a plurality of successive approximation bits; and determine the digital output signal based, at least in part, on the one or more pipeline bits, the one or more comparator bits, and the plurality of successive approximation bits.

24. The electronic device of claim 23, wherein the signal processing unit operable to determine the digital output signal based, at least in part, on the one or more pipeline bits, the one or more comparator bits, and the plurality of successive approximation bits comprises the signal processing unit operable to:

determine a first of the plurality of successive approximation bits that is a most significant bit of the plurality of successive approximation bits;

add the first of the plurality of the successive approximation bits to the one or more comparator bits to yield one or more most significant successive approximation output bits;

designate remainder of the plurality of the successive approximation bits that do not comprise the first of the plurality of the successive approximation bits as least significant successive approximation output bits; and combine the one or more pipeline bits, the one or more most significant successive approximation output bits, and the least significant successive approximation output bits to yield the digital output signal.

25. The electronic device of claim 23, wherein signal processing unit operable to execute the pipeline processing operations on the analog input signal to generate the one or more pipeline bits and the analog residue signal further comprises signal processing unit operable to:
    execute analog-to-digital conversion operations on the analog input signal to generate the one or more pipeline bits;
    execute digital-to-analog conversion operations on the one or more pipeline bits to determine an analog representation of the one or more pipeline bits; and
    subtract the analog representation of the one or more pipeline bits from the analog input signal to generate the analog residue signal.

26. The electronic device of claim 25, wherein
    the analog residue signal is fed back to the plurality of comparators of the pipeline analog-to-digital converter to generate the one or more comparator bits, or
    the analog residue signal is provided to a second plurality of comparators associated with respective ones of a second plurality of predetermined thresholds to generate the one or more comparator bits.

27. The electronic device of claim 23,
    wherein the signal processing unit operable to compare the analog residue signal against the plurality of predetermined thresholds to generate one or more comparator bits comprises signal processing unit operable to:
        determine that the analog residue signal lies within a current range bounded by a first of the plurality of predetermined thresholds and a second of the plurality of predetermined thresholds; and
        identify the one or more comparator bits based, at least in part, on the current range bounded by the first of the plurality of predetermined thresholds and the second of the plurality of predetermined thresholds; and
    wherein signal processing unit operable to execute successive approximation analog-to-digital conversion operations on the analog residue signal to generate the plurality of successive approximation bits comprises the signal processing unit operable to:
        determine, based on the one or more comparator bits, an extended detection range and an initial detection threshold; and
        execute the successive approximation analog-to-digital conversion operations on the analog residue signal to generate the plurality of successive approximation bits based, at least in part, on the extended detection range and the initial detection threshold.

* * * * *